US012724042B2

(12) United States Patent
Kanev et al.

(10) Patent No.: US 12,724,042 B2
(45) Date of Patent: Sep. 1, 2026

(54) POSITIONING METHOD AND PROBE SYSTEM FOR PERFORMING THE SAME, METHOD FOR OPERATING PROBE SYSTEM, AND METHOD FOR UTILIZING PROBE SYSTEM TO PRODUCE A TESTED SEMICONDUCTOR DEVICE

(71) Applicant: MPI CORPORATION, Zhubei City (TW)

(72) Inventors: Stojan Kanev, Zhubei City (TW); Chien-Hung Chen, Zhubei City (TW); Ming-Yang Liu, Zhubei City (TW); Yu-Hsun Hsu, Zhubei City (TW); Yan-Cheng Chen, Zhubei City (TW); Lin-Lin Chih, Zhubei City (TW)

(73) Assignee: MPI CORPORATION, Zhubei City (TW)

( * ) Notice: Subject to any disclaimer, the term of this patent is extended or adjusted under 35 U.S.C. 154(b) by 175 days.

(21) Appl. No.: 18/402,824

(22) Filed: Jan. 3, 2024

(65) Prior Publication Data

US 2024/0219427 A1 Jul. 4, 2024

Related U.S. Application Data

(60) Provisional application No. 63/436,883, filed on Jan. 4, 2023.

(51) Int. Cl.

| | |
|---|---|
| ***G01R 1/073*** | (2006.01) |
| ***G01R 31/00*** | (2006.01) |
| ***G01R 31/26*** | (2020.01) |

(52) U.S. Cl.
CPC ....... *G01R 1/07392* (2013.01); *G01R 31/003* (2013.01); *G01R 31/2607* (2013.01)

(58) Field of Classification Search
None
See application file for complete search history.

(56) References Cited

U.S. PATENT DOCUMENTS

| | | | | |
|---|---|---|---|---|
| 4,328,553 A * | 5/1982 | Fredriksen | B28D 5/0082 | 125/35 |
| 4,677,474 A * | 6/1987 | Sato | H10P 72/0606 | 324/762.05 |
| 5,394,100 A * | 2/1995 | Bohler | G01R 31/311 | 356/3 |

(Continued)

FOREIGN PATENT DOCUMENTS

| | | |
|---|---|---|
| TW | M502849 U | 6/2015 |
| TW | M578877 U | 6/2019 |
| WO | 2004036641 A1 | 4/2004 |

*Primary Examiner* — Richard Isla
(74) *Attorney, Agent, or Firm* — troutman pepper locke; Tim Tingkang Xia, Esq.

(57) ABSTRACT

A positioning method and probe system for performing the same, a method for operating probe system, and a method for utilizing probe system to produce a tested semiconductor device are provided. The positioning method is used for positioning a plurality of probe assemblies with an under-test device including a plurality of pads, each of the probe assemblies have at least one probe tip that corresponds to each of the pads for contact, and at least one fixed probe assembly and at least one motorized probe assembly are defined among the probe assemblies during a positioning process.

17 Claims, 15 Drawing Sheets

(56) References Cited

U.S. PATENT DOCUMENTS

| | | | | |
|---|---|---|---|---|
| 5,994,909 | A * | 11/1999 | Lucas | G01R 31/2887<br>324/763.01 |
| 6,111,421 | A * | 8/2000 | Takahashi | G01R 31/2887<br>324/750.04 |
| 7,119,566 | B2 * | 10/2006 | Kim | G01R 31/2887<br>324/750.19 |
| 8,497,693 | B2 * | 7/2013 | Kiesewetter | G01R 31/2891<br>324/750.03 |
| 9,354,252 | B2 * | 5/2016 | Edwards | G01R 31/2891 |
| 9,702,930 | B2 * | 7/2017 | Edwards | G01R 1/07364 |
| 10,877,070 | B2 * | 12/2020 | Frankel | G01R 1/08 |
| 11,054,465 | B2 * | 7/2021 | Lou | G01R 1/07364 |
| 11,119,148 | B2 * | 9/2021 | Nieves | G01R 31/2891 |
| 2007/0096763 | A1 | 5/2007 | Ehrmann et al. | |
| 2011/0221461 | A1 | 9/2011 | Kanev et al. | |
| 2023/0314505 | A1 * | 10/2023 | Giessmann | G01R 31/308<br>324/754.23 |

* cited by examiner

POSITIONING METHOD AND PROBE SYSTEM FOR PERFORMING THE SAME, METHOD FOR OPERATING PROBE SYSTEM, AND METHOD FOR UTILIZING PROBE SYSTEM TO PRODUCE A TESTED SEMICONDUCTOR DEVICE

CROSS-REFERENCE TO RELATED PATENT APPLICATION

This application claims the benefit of priority to the U.S. Provisional Patent Application Ser. No. 63/436,883, filed on Jan. 4, 2023, which application is incorporated herein by reference in its entirety.

Some references, which may include patents, patent applications and various publications, may be cited and discussed in the description of this disclosure. The citation and/or discussion of such references is provided merely to clarify the description of the present invention and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present invention relates to a method for testing an electronic component under preset thermal conditions. The electronic component to be tested is electrically contacted for feeding-in or picking-up a test signal by at least two probe assemblies.

BACKGROUND OF THE DISCLOSURE

Probe systems are adopted to enable computer-controlled circuit testers to exercise various portions of circuitry contained within an electronic component (i.e. an under-test device, DUT). A critical feature of the probe system is its ability to accurately position probe tips of probe assemblies to be in contact with pads on the under-test device at a sufficient contact pressure, so as to ensure a reliable electrical connection.

In the related art, during a testing process of electronic components, the probe assembly may thermally expand and "drift" with the electronic components in response to changes of an operating temperature. Therefore, it is necessary to compensate for the aforementioned drift by moving a chuck and the probe tip of the probe assembly.

While the above problems can be improved by using programmable positioners to control a plurality of motorized probe assemblies, installation costs of each motorized probe assembly can be quite high.

SUMMARY OF THE DISCLOSURE

In response to the above-referenced technical inadequacies, the present invention provides a positioning method for a testing process.

In order to solve the above-mentioned problems, one of the technical aspects adopted by the present invention is to provide a positioning method. The positioning method is used for positioning a plurality of probe assemblies with an under-test device having a plurality of pads, each of the probe assemblies have at least one probe tip that corresponds to each of the pads for contact, and at least one fixed probe assembly and at least one motorized probe assembly are defined among the probe assemblies. The positioning method includes: setting the under-test device at a first preset temperature, wherein the under-test device is disposed on a chuck that is movable. Conducting a first positioning step that is of arranging all of the probe assemblies to be on standby, wherein at least one probe tip contacts the pad continuously, and the pads are situated at a predetermined distance below the probe tip along a vertical direction. Conducting a second positioning step that is of positioning a first probe tip of the fixed probe assembly according to a first pad of the under-test device, wherein the first pad is contacted by the first probe tip of the fixed probe assembly for moving the chuck along the vertical direction. Conducting a third positioning step that is of positioning a first probe tip of the motorized probe assembly according to a second pad of the under-test device, wherein the second pad is contacted by moving the first probe tip of the motorized probe assembly along the vertical direction.

By setting the at least one fixed probe assembly and using the at least one motorized probe assembly to position the pads of the under-test device (such as x-y axis positioning) during the testing process, the quantity of the motorized probe assembly can be reduced, and the costs of the testing process can be reduced.

In one of the possible or preferred embodiments, the positioning method further includes: conducting a fourth positioning step, moving the chuck along the vertical direction to make the first pad physical contact with the first probe tip of the fixed probe assembly; and conducting a fifth positioning step, moving motorized probe assembly along the vertical direction to make the second pad physical contact with the first probe tip of the motorized probe assembly.

In one of the possible or preferred embodiments, the positioning method further includes: heating the under-test device to raise the under-test device from the first preset temperature to a second preset temperature; and performing the second positioning step to the third positioning step again. Usually, electronic components are at high temperatures during operation. As such, the under-test device needs a simulated high-temperature environment. After heating, the probe tips of the probe assemblies will thermally expand, thereby resulting in the aforementioned drift. According to the embodiment, the first probe tip of the fixed probe assembly and the first probe tip of the motorized probe assembly can return to an original relative position.

In one of the possible or preferred embodiments, the positioning method further includes: heating the under-test device to raise the under-test device from the first preset temperature to a second preset temperature; performing the second positioning step to the third positioning step again; and performing the fourth positioning step to the fifth positioning step again. As mentioned above, after heating, the probe tips of the probe assemblies thermally expand and drift along the vertical direction. As such, according to the embodiment, the first probe tip of the fixed probe assembly and the first probe tip of the motorized probe assembly can return to an original relative position.

In one of the possible or preferred embodiments, the positioning method further includes: conducting a record step, using the first probe tip of the fixed probe assembly or the first pad as a reference target, recording a relative pitch between the first probe tip of the fixed probe assembly and the first probe tip of the motorized probe assembly; heating the under-test device to raise the under-test device from the first preset temperature to a second preset temperature; and conducting a restore step, according to the relative pitch recorded, returning to an original relative position of the first probe tip of the fixed probe assembly and the first probe tip of the motorized probe assembly in the working region. Since the original relative position of the first probe tip of the fixed probe assembly and the first probe tip of the motorized probe assembly has been recorded, if the thermal drift occurs after heating, the motorized probe assembly can be moved back and return to the original relative position with the first probe tip of the fixed probe assembly based on the relative pitch recorded.

In one of the possible or preferred embodiments, the positioning method further includes: recording the position of the chuck and the first probe tip of the motorized probe assembly in the vertical direction when the first probe tip of the motorized probe assembly contacts the second pad. When the thermal drift occurs later, the record can be used to return the chuck and the first probe tip of the motorized probe assembly to an original relative position.

In order to solve the above-mentioned problems, another one of the technical aspects adopted by the present invention is to provide a probe system configured to test one or more under-test devices having a plurality of pads. The probe system comprises a chuck, a plurality of probe assemblies, an imaging device, and a controller. The chuck configures to support a substrate that has one or more under-test devices. The probe assemblies having at least one fixed probe assembly and at least one motorized probe assembly. The imaging device configures to obtain an optical image related to the under-test device and the probe assembly. The controller programmed to perform a positioning method, comprising the steps of: setting the under-test device at a first preset temperature, wherein the under-test device is disposed on the chuck that is movable. Conducting a first positioning step that is of arranging all of the probe assemblies to be on standby, wherein at least one probe tip contacts the pad continuously, and the pads are situated at a predetermined distance below the probe tip along a vertical direction. Conducting a second positioning step that is of positioning a first probe tip of the fixed probe assembly according to a first pad of the under-test device, wherein the first pad is contacted by the first probe tip of the fixed probe assembly for moving the chuck along the vertical direction. Conducting a third positioning step that is of positioning a first probe tip of the motorized probe assembly according to a second pad of the under-test device, wherein the second pad is contacted by moving the first probe tip of the motorized probe assembly along the vertical direction.

In order to solve the above-mentioned problems, yet another one of the technical aspects adopted by the present invention is to provide a method for operating a probe system to test an under-test device. The under-test device having a plurality of pads. The method includes: providing the probe system, including a plurality of probe assemblies, each of the probe assemblies have at least one probe tip that corresponds to each of the pads for contact, and at least one fixed probe assembly and at least one motorized probe assembly are defined among the probe assemblies; setting the under-test device to a first preset temperature, in which the under-test device is on a movable chuck; arranging all of the probe assemblies to be on standby, wherein at least one probe tip contacts the pad continuously, and the pads are situated at a predetermined distance below the probe tip along a vertical direction; positioning a first probe tip of the fixed probe assembly with a first pad in the working region, in which the first pad is to be contacted by the first probe tip of the fixed probe assembly; and positioning a first probe tip of the motorized probe assembly with a second pad in the working region, in which the second pad is to be contacted by the first probe tip of the motorized probe assembly.

In order to solve the above-mentioned problems, still another one of the technical aspects adopted by the present invention is to provide a non-transitory computer readable storage media, which includes a plurality of computer-executable instructions. When the computer-executable instructions are executed, direct a probe system to perform the positioning method mentioned above.

In order to solve the above-mentioned problems, still yet another one of the technical aspects adopted by the present invention is to provide a method for producing a tested semiconductor device, which includes: performing the positioning method mentioned above; and testing the semiconductor device disposed in a probe system with the probe assemblies.

According to one of the embodiments of the present invention, by arranging the at least one fixed probe assembly and cooperating with the at least motorized probe assembly to position the pads of the under-test device (such as x-y axis positioning) during the testing process, the quantity of the motorized probe assemblies can be reduced, and the costs of the testing process can be reduced.

According to one of the embodiments of the present invention, after heating, the first probe tip of the fixed probe assembly, the first probe tip of the motorized probe assembly, and the pads undergo the thermal drift. The first probe tip of the fixed probe assembly and the first probe tip of the motorized probe assembly can return to the relative pitch. In other words, the first probe tip of the fixed probe assembly and the first probe tip of the motorized probe assembly can be restored to an original relative position.

These and other aspects of the present invention will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

Figure 1:
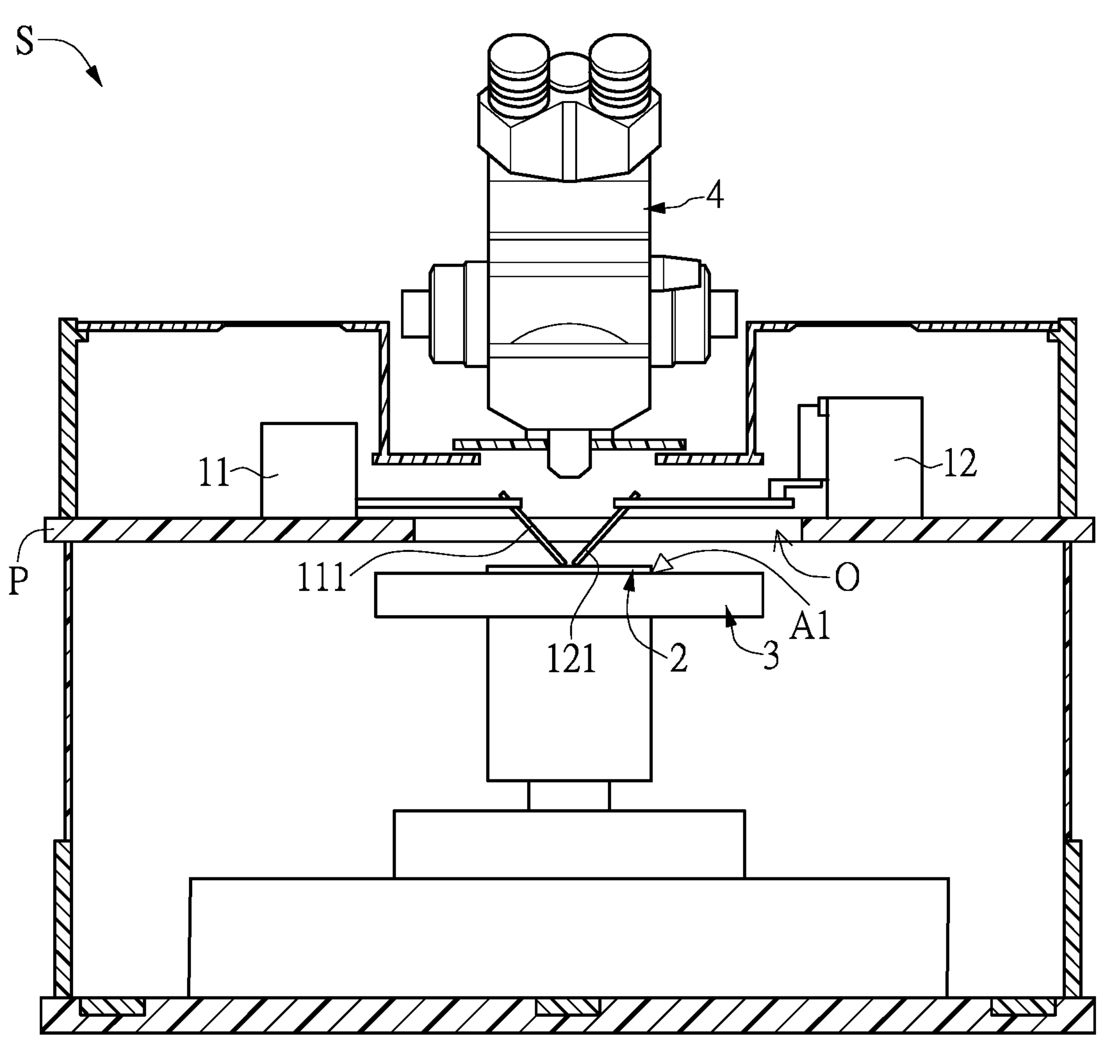
FIG. 1 is a schematic view showing a structure of a plurality of probe assemblies according to one embodiment of the present invention.

The present invention is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a," "an" and "the" includes plural reference, and the meaning of "in" includes "in" and "on." Titles or subtitles can be used herein for the convenience of a reader, which shall have no influence on the scope of the present invention.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present invention or of any exemplified term. Likewise, the present invention is not limited to various embodiments given herein. Numbering terms such as "first," "second" or "third" can be used to describe various components, signals or the like, which are for distinguishing one component/signal from another one only, and are not intended to, nor should be construed to impose any substantive limitations on the components, signals or the like.

First Embodiment

Figure 2:
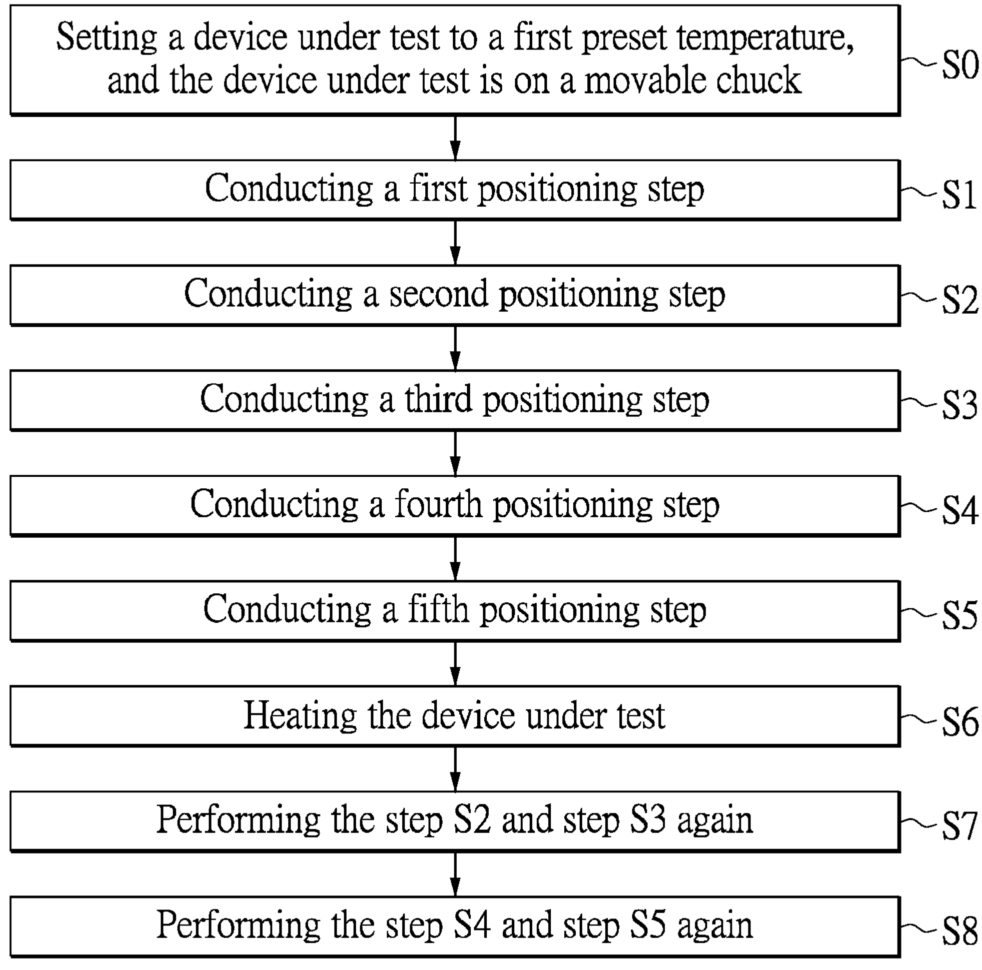
FIG. 2 is a flowchart of a positioning method according to a first embodiment of the present invention.

Referring to FIG. 1 and FIG. 2, a first embodiment of the present invention provides a positioning method 100, which is used for positioning a plurality of probe assemblies 1 with an under-test device 2. The under-test device 2 is disposed on a wafer 5 (as shown in FIG. 3 to FIG. 7). The under-test device 2 has a plurality of pads, and each of the probe assemblies 1 have at least one probe tip corresponding to each of the pads for contacting. During a positioning process, at least one fixed probe assembly 11 and at least one motorized probe assembly 12 are defined among the probe assemblies 1.

A method 100 comprises the steps of S0 to S5. The step S0 is of defining a first preset temperature for the under-test device 2, wherein the under-test device 2 is on a movable chuck 3. The chuck 3 includes a chuck drive. By the chuck drive, the under-test device 2 disposed on the wafer 5 can be moved in the X-Y plane (i.e., in the plane of a wafer surface), and in the Z-direction perpendicular thereto. In addition, by the chuck drive, the wafer 5 can be rotated about an angle θ about a central axis of the chuck 3 (an axis thereof runs in the Z-direction). The chuck 3 can be heated in order to heat the wafer 5 to the temperature required for the test. Alternatively, the chuck 3 can also be cooled.

A method for testing the under-test device 2 of the wafer 5 described below can be applied equally well at temperatures above and below the ambient temperature around a probe system S. Each motorized probe assembly 12 includes a motor-driven manipulator (represented by arrows for the possible movement directions). By the motor-driven manipulator, each probe assembly 12 can be moved, independently of the others, in the X-, Y- and Z-directions, or each motorized probe assembly 12 is movable with respect to the under-test device 2 supporting with chuck 3 in the X-, Y- and Z-directions. The fixed probe assembly 11 is fixedly mounted on a plate P, and the motorized probe assembly 12 is pre-mounted on the plate P, such that the arrangement of probe tips (111, 121) are situated above a work region A1 of a central opening O of the plate P. The probe tips (111, 121) all end in a plane in the Z-direction, and correlates with the arrangement of pads 22 of the under-test device 2 at an initial temperature (i.e., the first preset temperature). Moreover, there is an angular alignment of the pad arrangement with respect to the probe arrangement.

The step S1 is of conducting a first positioning step, which relates to that all the probe assemblies 1 are in a standby position, at least one of the pads being situated in a working region A1 (see FIG. 16) where a contacting will take place in the working region A1, and the pads are situated at a defined distance below the at least one probe tip along a vertical direction D1. The step S2 is of conducting a second positioning step, which is to position a first probe tip 111 of the fixed probe assembly 11 according to a first pad 21 in the working region A1, wherein the first pad 21 is to be contacted by the first probe tip 111 of the fixed probe assembly. The step S3 is of conducting a third positioning step, which is to position a first probe tip 121 of the motorized probe assembly 12 according to a second pad 22 in the working region A1, wherein the second pad 22 is to be contacted by the first probe tip 121 of the motorized probe assembly first probe tip 121 of the motorized probe assembly.

According to some embodiments, after conducting step S2 and step S3, the first probe tip 111 of the fixed probe assembly 11 and the first probe tip 121 of the motorized probe assembly are positioned above the uppermost surface of the under-test device 2. More specifically, the first probe tip 111 of the fixed probe assembly 11 and the first probe tip 121 of the motorized probe assembly of the motorized probe assembly 12 are not physical contact with the pad 21, 22 of the under-test device 2.

According to some embodiments, after completing step S3, a height of the first probe tip 111 of the fixed probe assembly in the vertical direction D1 is lower than a height of the first probe tip 121 of the motorized probe assembly in the vertical direction D1. In other words, the first probe tip 111 of the fixed probe assembly 11 is closer to the first pad 21. The positioning of the first probe tip 111 of the fixed probe assembly 11 with the first pad 21 may include translating the under-test device 2 to substantially align a pad of the under-test device 2 with a corresponding one of the first probe tip 111 of the fixed probe assembly. The positioning of the first probe tip 121 of the motorized probe assembly 12 with the second pad 22 may include translating the first probe tip 121 of the motorized probe assembly 12 to substantially align the first probe tip 121 of the motorized probe assembly 12 with a corresponding pad of the under-test device 2.

Figure 3:
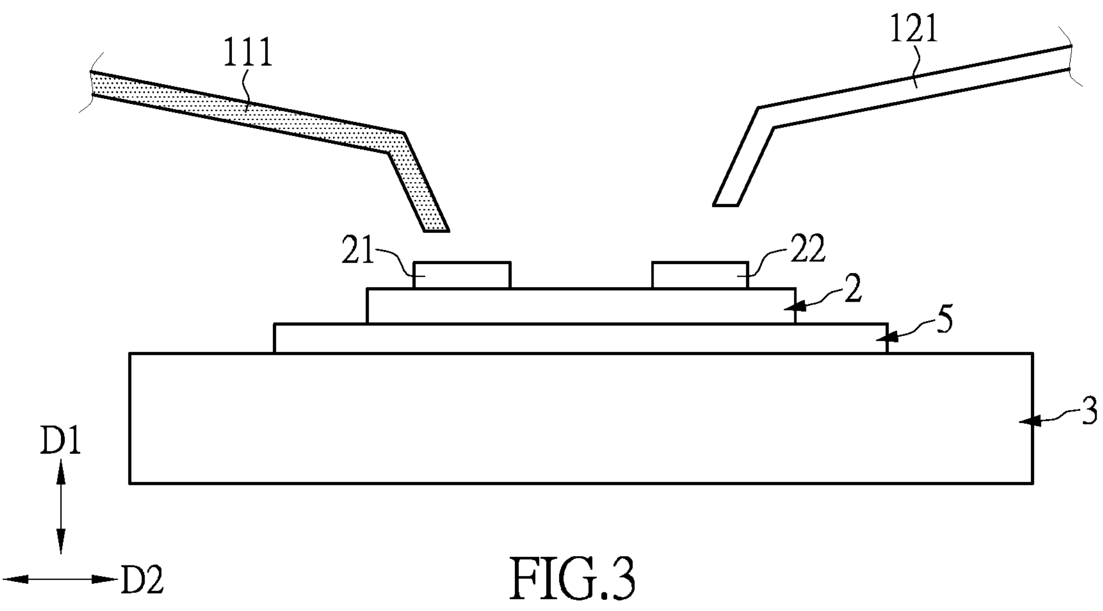
FIGS. 3 to 7 are each a schematic diagram illustrating a relationship between a probe assembly and an under-test device according to the first embodiment of the present invention.

After completing step S3, the first probe tip 111 of the fixed probe assembly is positioned in a horizontal direction D2 of the X-Y plane with the first pad 21, and the first probe tip 121 of the motorized probe assembly 12 is positioned with the second pad 22 (as shown in FIG. 3). In other words, the first probe tip 111 of the fixed probe assembly 11 projects along the vertical direction D1, and at least part of its projection is located on the first pad 21.

Figure 4:
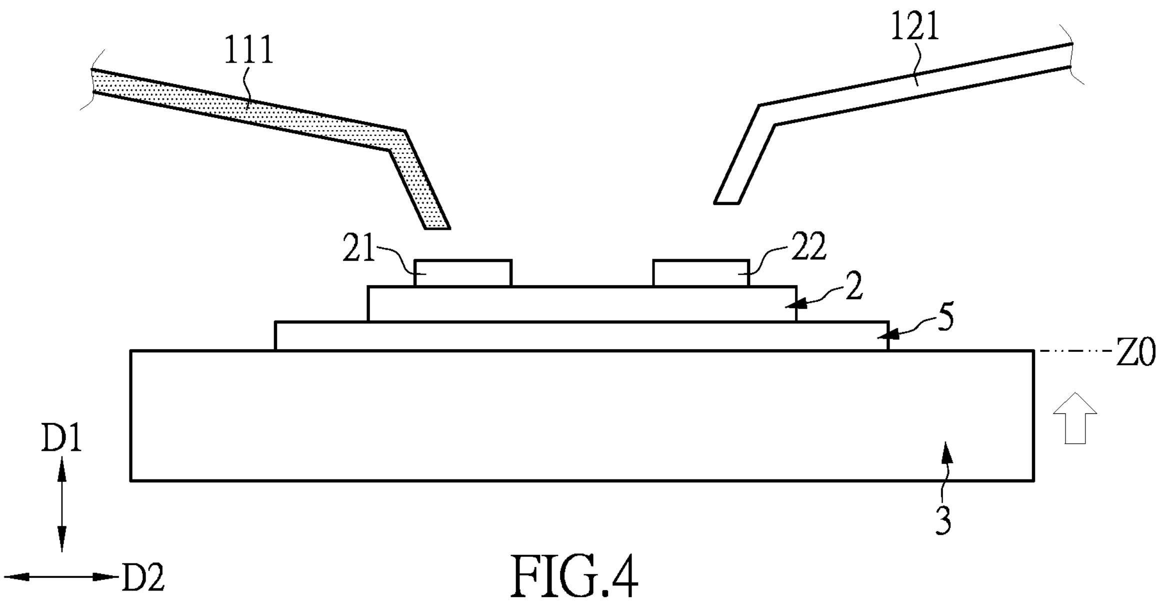
Figure 5:
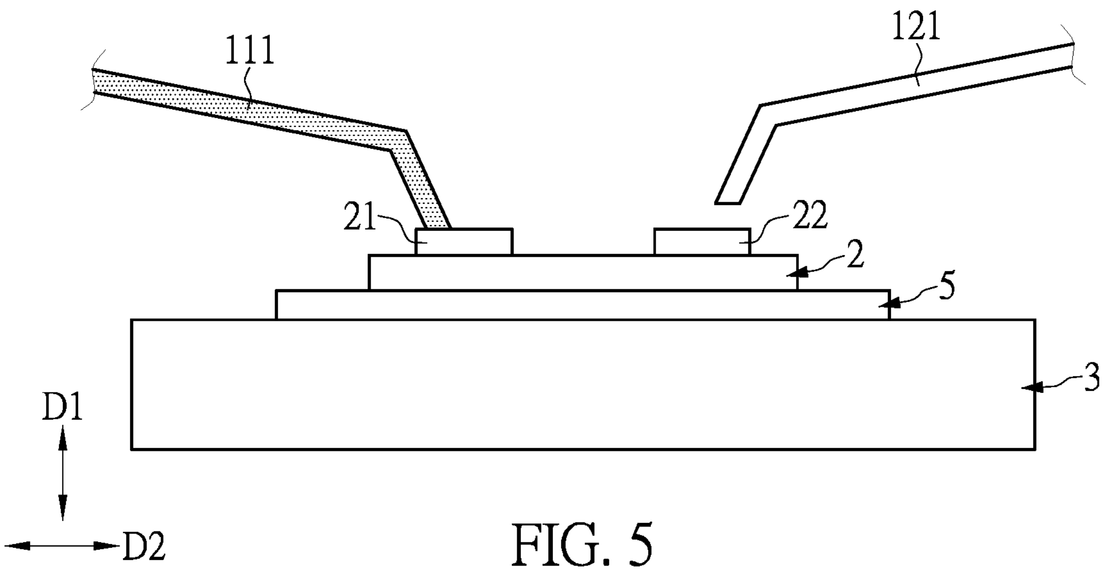
Figure 6:
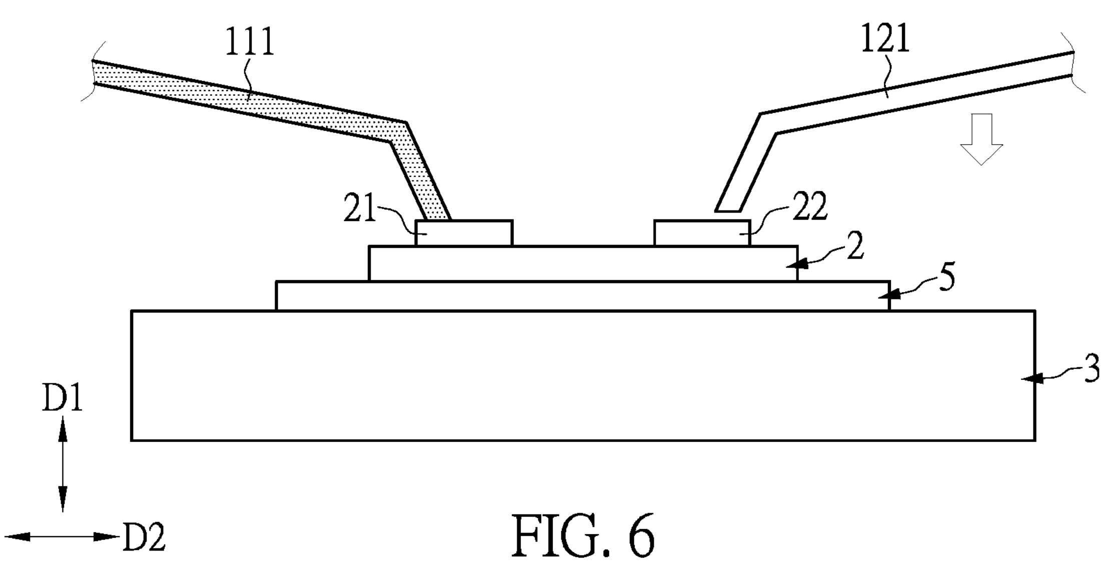
Figure 7:
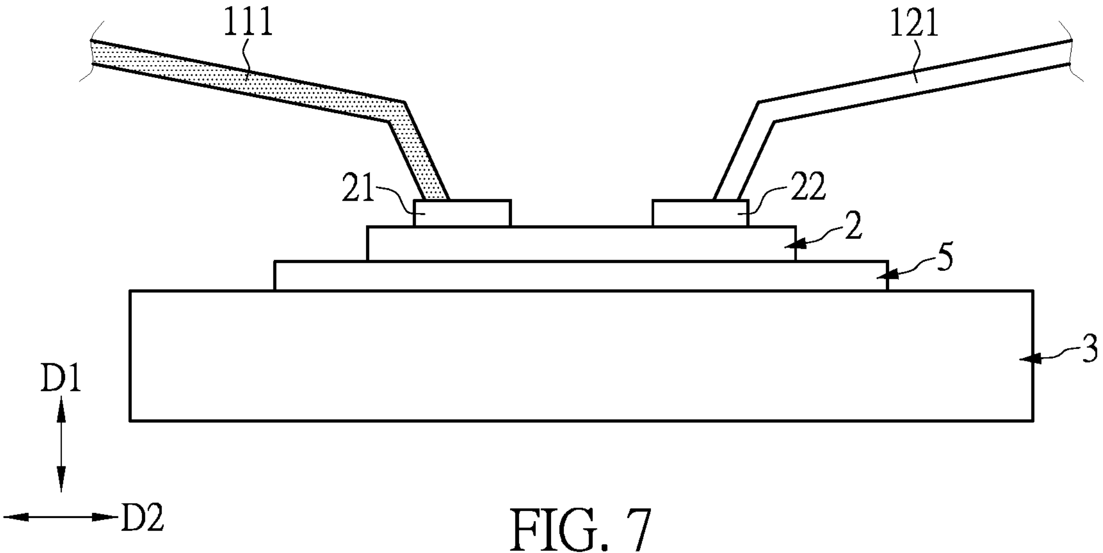

Reference is made to FIG. 1, and FIG. 4 to FIG. 7. The method 100 further includes steps S4 and S5. The step S4 is of conducting a fourth positioning step, which is to move the chuck 3 upward along the vertical direction D1, so as to enable the first pad 21 to be in physical contact with the first probe tip 111 of the fixed probe assembly 11 (as shown in FIG. 4 and FIG. 5). The step S5 is of conducting a fifth positioning step, which is to move the motorized probe assembly 12 downward along the vertical direction D1, so as to enable the first probe tip 121 of the motorized probe assembly 12 physical contact with the second pad 22 (as shown in FIG. 6 and FIG. 7).

The "physical contact" includes two situations. One is that the probe tip contacts a surface of pad. The other is that the chuck or probe assemblies moves in the vertical direction D1, causing the tip to not only contacts the surface of the pad, but also further slides on the pad in the horizontal direction D2, resulting in a "skate distance" (the probe tip creates a scrub on the surface of the pad).

After completing step S5, the positioning of the first probe tip 111 of the fixed probe assembly and the first pad 21 along the vertical direction D1 under the condition of the first preset temperature is completed, and the positioning of the first probe tip 121 of the motorized probe assembly 12 and the second pad 22 along the vertical direction D1 is completed as well, wherein the first preset temperature may be a normal temperature, such as 25° C.

Referring to FIG. 2, the method 100 further includes steps S6 to S7. The step S6 is of heating the under-test device 2 to increase the first preset temperature to a second preset temperature. More specifically, before the under-test device 2 is tested, the chuck 3 is used to set the wafer 5 at a test temperature (i.e., the second preset temperature). The test temperature differs from the initial temperature (i.e., the first preset temperature). The step S7 is of performing the steps of S2 to S3 again. In step S6, for example, the chuck 3 has a heater, which can heat the under-test device 2 so that the under-test device 2 reaches the second preset temperature from the first preset temperature.

After completing step S7, the first probe tip 111 of the fixed probe assembly is positioned along the horizontal direction D2 on the first pad 21 under the second preset temperature, and the first probe tip 121 of the motorized probe assembly 12 is positioned on the second pad 22 along the horizontal direction D2 under the second preset temperature. The second preset temperature may be an operating temperature of the under-test device 2, such as 150° C.

The method 100 further includes step S8. Step S8 is to perform step S4 and step S5 again. After completing step S8, the first probe tip 111 of the fixed probe assembly is positioned in the vertical direction D1 with the first pad 21 at the second preset temperature, and the first probe tip 121 of the motorized probe assembly 12 is positioned with the second pad 22 in the vertical direction D1 at the second preset temperature. The second preset temperature may be the operating temperature of the under-test device 2, such as 150° C.

Second Embodiment

Figure 8:
FIG. 8 is a flowchart of the positioning method according to a second embodiment of the present invention.
Figure 8:
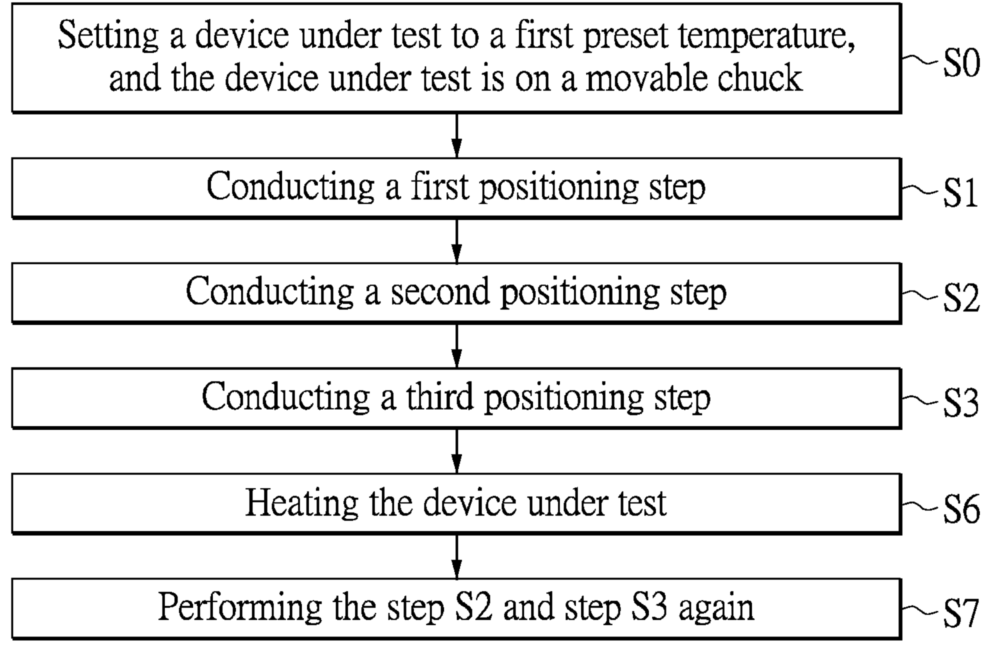

Referring to FIG. 8, a second embodiment of the present invention provides a positioning method 200, which is used for positioning the probe assemblies 1 with the under-test device 2. According to the second embodiment, the positioning method 200 comprises the steps of S0 to S3 and the steps of S6 to S7, which are the same as those mentioned in the method 100. After completing the step S7, the first probe tip 111 of the fixed probe assembly is positioned along the horizontal direction D2 on the first pad 21 under the second preset temperature, and the first probe tip 121 of the motorized probe assembly 12 is positioned on the second pad 22 along the horizontal direction D2 under the second preset temperature.

Third Embodiment

Figure 9:
FIG. 9 is a flowchart of the positioning method according to a third embodiment of the present invention.
Figure 9:
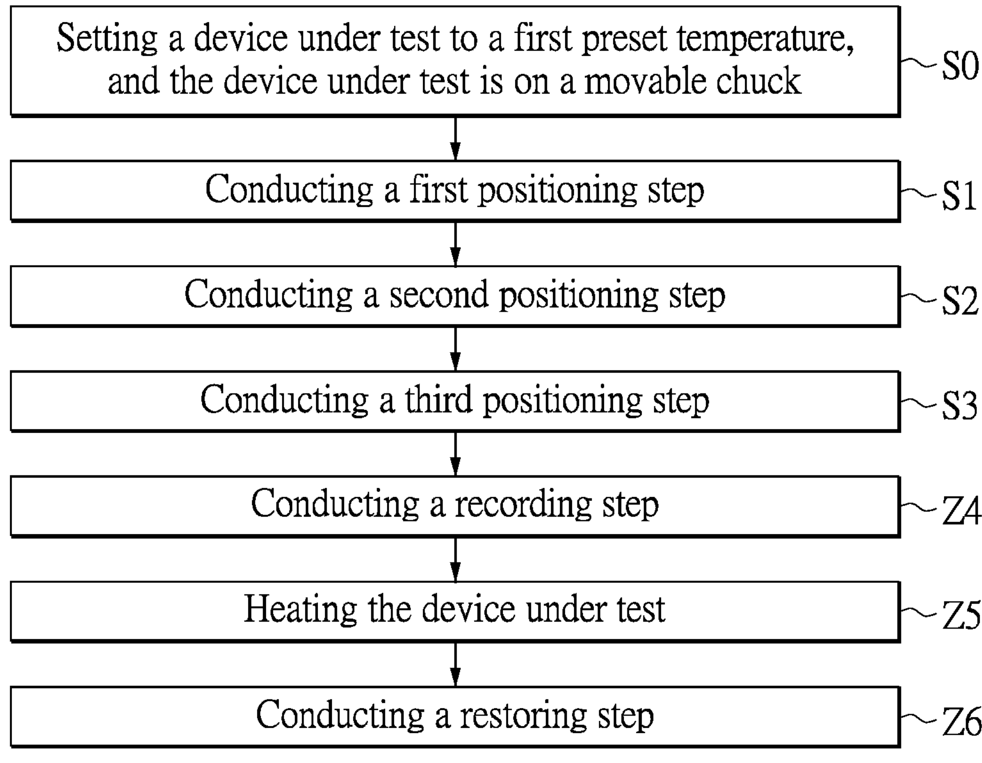

Referring to FIG. 9, a third embodiment of the present invention provides a method 300 for positioning a plurality of probe assemblies 1 with a under-test device 2. According to the third embodiment, the method 300 comprises the steps of S0 to S3, which are the same as the method 100, on the other hand, the method 300 further comprises the steps of Z4 to Z6. The step Z4 is of conducting a recording step, which defines the first probe tip 111 of the fixed probe assembly 11 or the first pad 21 as a reference target, and records a relative pitch between the first probe tip 111 of the fixed probe assembly and the first probe tip 121 of the motorized probe assembly 12, or records a relative pitch between the first probe tip 111 of the fixed probe assembly 11 and the first pad 21. When the first pad 21 is used as the reference target, according to the relationship between the first probe tip 111 of the fixed probe assembly 11 and the first probe tip 121 of the motorized probe assembly 12 relative to the first pad 21, the relative pitch between the first probe tip 111 of the fixed probe assembly 11 and the first probe tip 121 of the motorized probe assembly 12 is obtained and recorded. The step Z5 is of heating the under-test device 2 to increase the first preset temperature to a second preset temperature. The step Z6 is of conducting a restoring step, wherein the first probe tip 111 of the fixed probe assembly and the first probe tip 121 of the motorized probe 12 in the working region A1 returns to an original relative position thereof according to a relative pitch recorded. As shown in FIG. 9, when the under-test device 2 and the probe assemblies 1 undergo a thermal drift, the under-test device 2 and the probe assemblies 1 can be automatically restored to their original positioning relationship along the horizontal direction D2. In other words, the relative relationship between the first probe tip 111 of the fixed probe assembly 11 and the first pad 21, and the relative relationship between the first probe tip 121 of the motorized probe assembly 12 and the second pad 22 in a horizontal direction D2 of the X-Y plane is the same as after performing step S3.

Fourth Embodiment

Figure 10:
FIG. 10 is a flowchart of the positioning method according to a fourth embodiment of the present invention.
Figure 10:
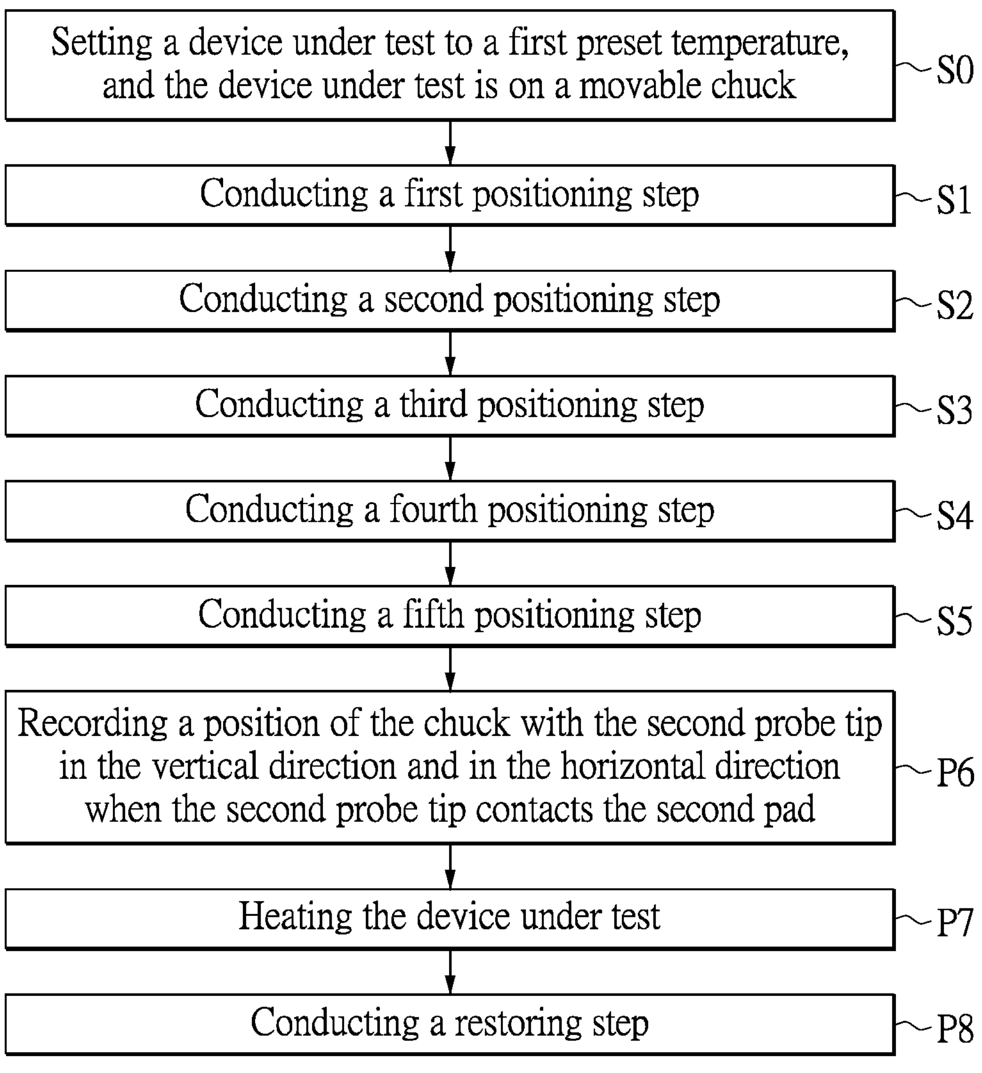

Referring to FIG. 10, a fourth embodiment of the present invention provides a method 400 for positioning a plurality of probe assemblies 1 with a under-test device 2. According to the fourth embodiment, the method 400 comprises the steps of S0 to S5, which are the same as the method 100, more, the method 400 further comprises the steps of P6 to P8. The step P6 is of recording, when the first probe tip 121 of the motorized probe assembly 12 contacts the second pad 22, a position of the chuck 3 with the first probe tip 121 of the motorized probe assembly 12 along the vertical direction D1 and the horizontal direction D2 is recorded. The step P7 is of heating, the chuck 3 heats the under-test device 2 to increase the first preset temperature to a second preset temperature. The step P8 is of conducting a restoring step that is of returning the first probe tip 121 of the motorized probe assembly 12 and the chuck to the position along the vertical direction D1 and the horizontal direction D2 according to the position recorded. As shown in FIG. 10, when the under-test device 2 and the probe assemblies 1 undergo the thermal drift, the chuck 3 and the first probe tip 121 of the motorized probe assembly 12 can automatically return to the recorded position. At this time, the first probe tip 111 of the fixed probe assembly 11, the first pad 21, the first probe tip 121 of the motorized probe assembly 12, and the second pad 22 return to their original positioning relationship along the vertical direction D1 and the horizontal direction D2, as after performing step S5.

Fifth Embodiment

Figure 11:
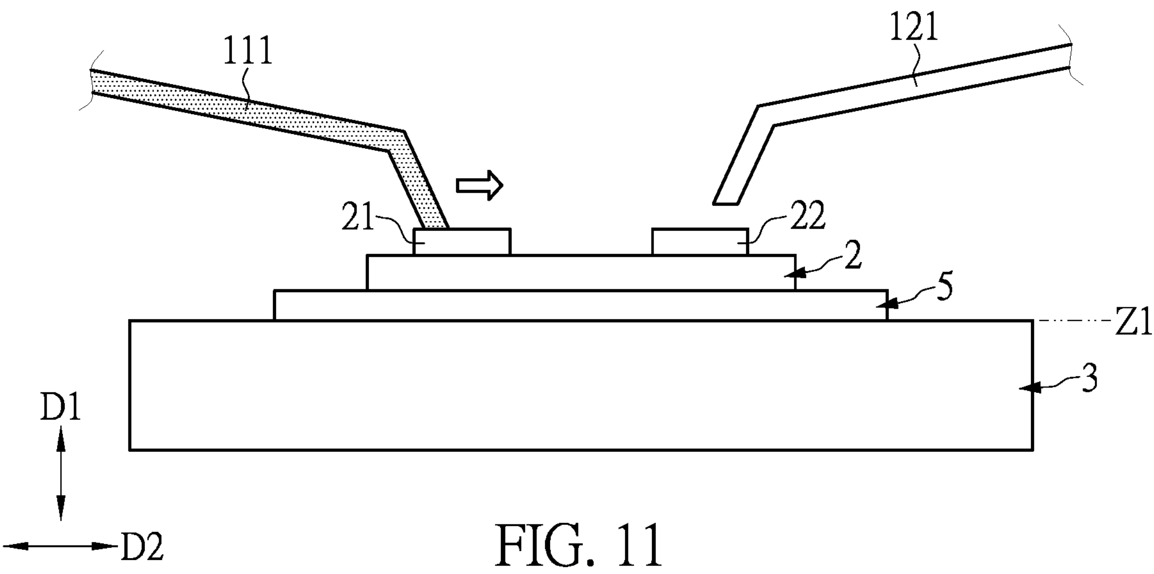
FIGS. 11 to 15 are each a schematic diagram illustrating the relationship between the probe assembly and the under-test device according to a fifth embodiment of the present invention.

Referring to FIGS. 4 and 5, which are to be read in conjunction with FIG. 11 to FIG. 15, a fifth embodiment of the present invention provides a positioning method, which is used for positioning the probe assemblies 1 with the under-test device 2. As shown in FIG. 4, define the initial position of chuck as Z0=0, and Z0 is the reference coordinate of chuck 3 on the Z-axis (vertical direction D1) travel. As shown in FIG. 5, when the first probe tip 111 of the fixed probe assembly 11 contacts the first pad 21, at this time, the first probe tip 111 of the fixed probe assembly and chuck 3 are at a contact height. According to some embodiments, when the chuck 3 moves upward along the vertical direction D1, the first probe tip 111 of the fixed probe assembly 11 will "vibrate" when it comes into contact with the first pad 21. Through the observation of imaging device 4, it has been determined that the first probe tip 111 of the fixed probe assembly 11 and the first pad 21 are in contacting, and the contact height is obtained. The chuck 3 continues to rise (i.e. applying an overdrive or an overtravel), thereby driving the first probe tip 111 of the fixed probe assembly 11 to slide/skate along a sliding direction D2 on the first pad 21. Simultaneously, an overdriven position Z1 (e.g., Z1=10 μm) of the chuck 3 along the vertical direction D1 is recorded, as shown in FIG. 11. According to some embodiments, when the chuck 3 moves upward along the vertical direction D1, the first probe tip 111 of the fixed probe assembly 11 moves a skate distance along the sliding direction D2 on the first pad 21. Observing the skate distance through imaging device 4 to determine when chuck to stop move toward the first probe 111, thereby obtaining the overdriven position Z1.

Figure 12:
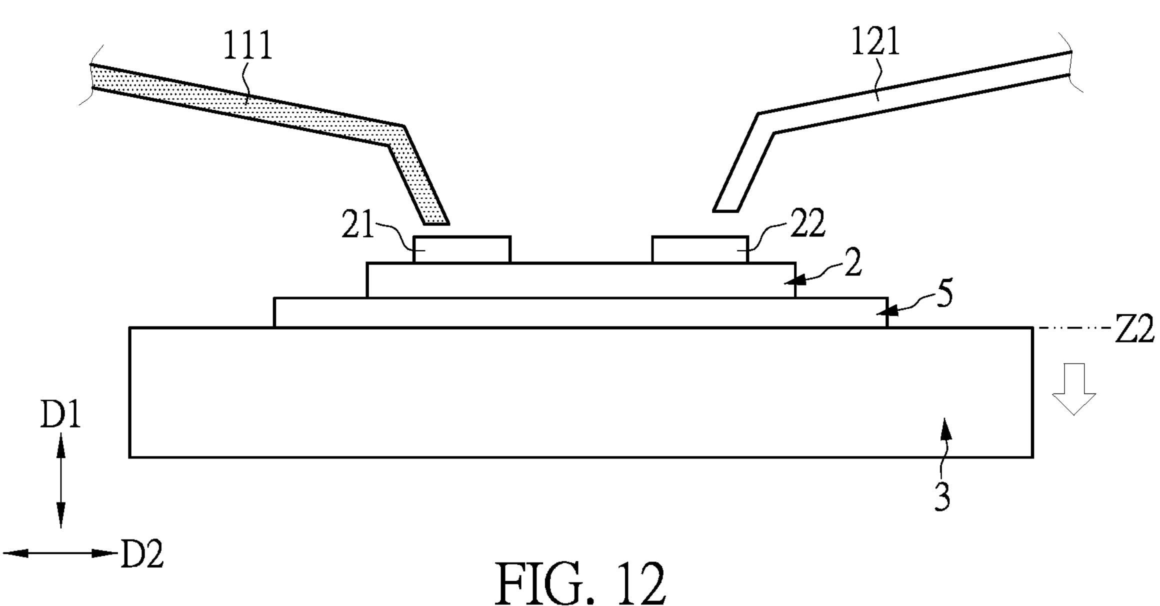
Figure 13:
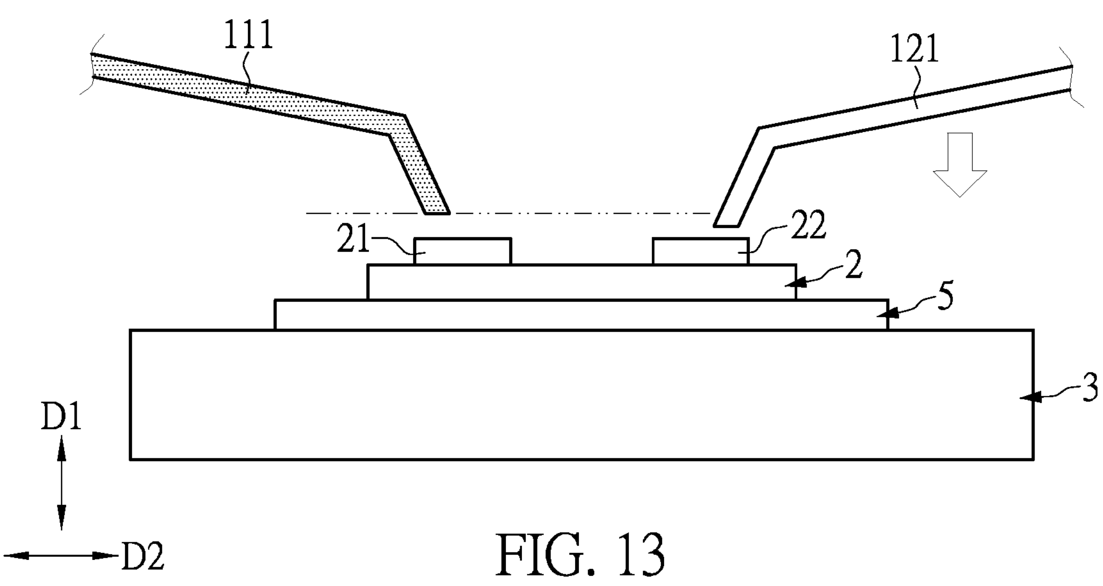
Figure 14:
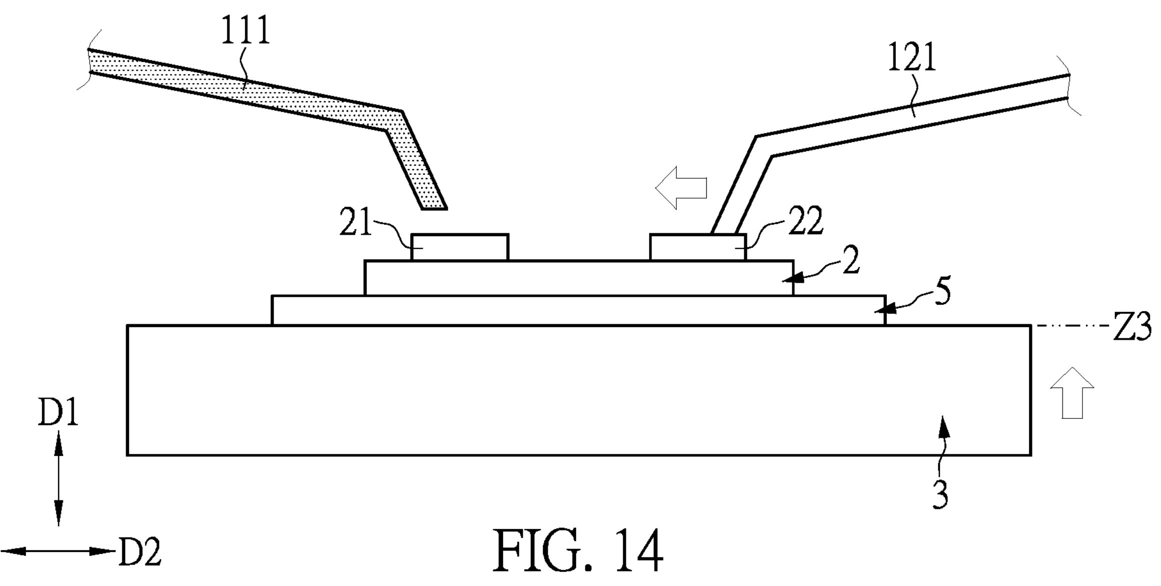
Figure 15:
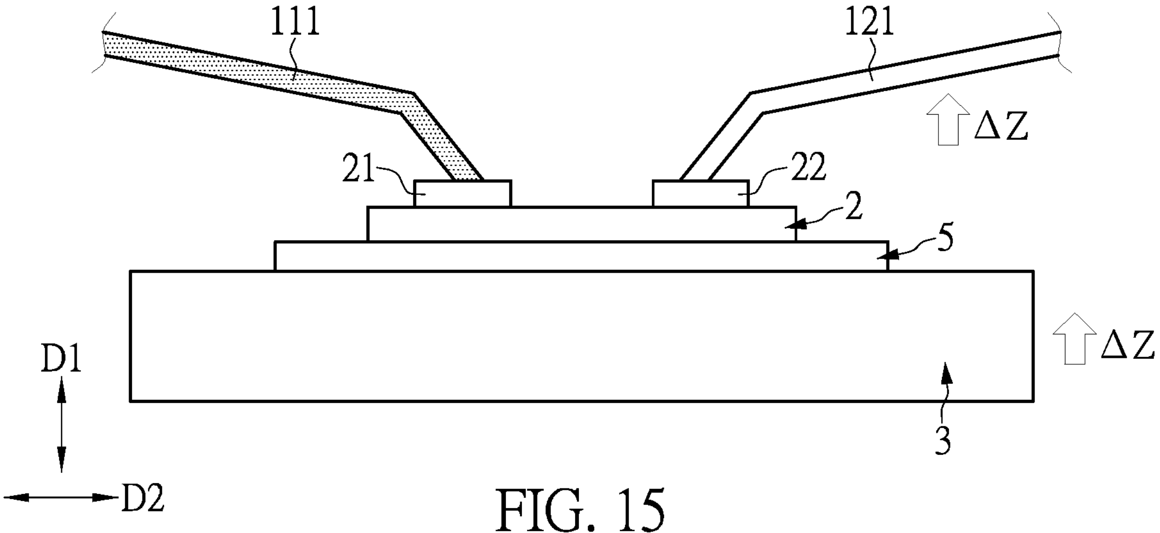

The chuck 3 then moves down along the vertical direction D1 to a position Z2 (e.g., Z2=−20 μm), as shown in FIG. 12. Then the first probe tip 121 of the motorized probe assembly 12 is moved downward to a position lower than the first probe tip 111 of the fixed probe assembly 11, as shown in FIG. 13. Then the chuck 3 is moved upward until the first probe tip 121 of the motorized probe assembly 12 contacts the second pad 22, and the chuck 3 continues going up, thereby causing the first probe tip 121 of the motorized probe assembly 12 to slide/skate on the second pad 22 along the sliding direction D2. Hence, a position Z3 (e.g., Z3=5 μm) of the chuck 3 is recorded, as shown in FIG. 14. A height difference AZ between the position Z1 and the position Z3 is calculated (e.g., AZ Z1-Z3=5 μm), and then the motorized probe 12 assembly and chuck 3 are upwardly moved further with the value of AZ along vertical direction D1 at the same time, so as to complete the positioning between the probe assemblies 1 and the under-test device 2, as shown in FIG. 15.

Sixth Embodiment

Figure 16:
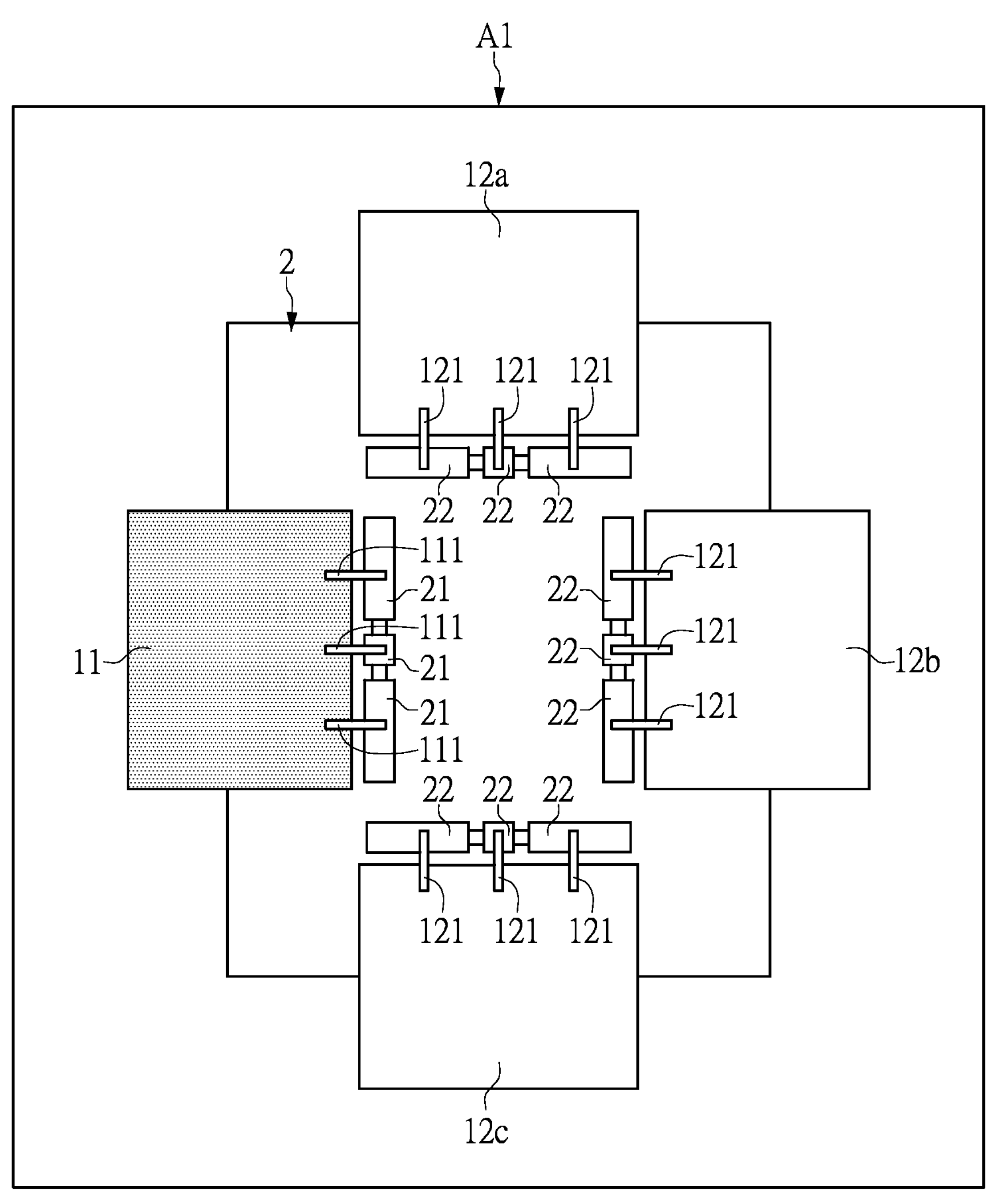
FIGS. 16 to 17 are each a schematic diagram illustrating the relationship between the probe assembly and the under-test device according to a sixth embodiment of the present invention.
Figure 17:
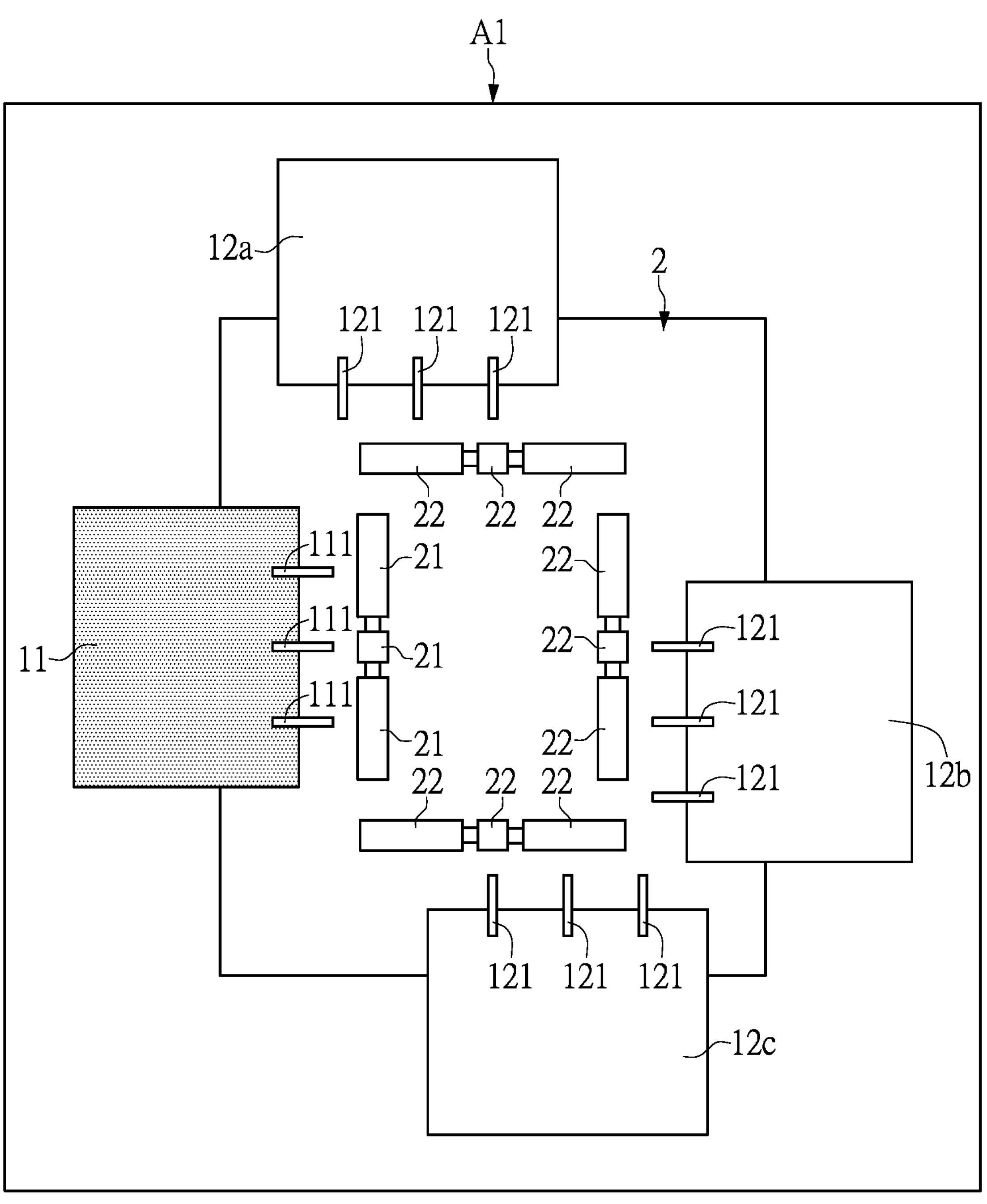

Reference is made to FIG. 16 and FIG. 17, which are each a schematic diagram illustrating the relationship between the probe assemblies 1 and the under-test device 2 according to a sixth embodiment of the present invention. In the sixth embodiment, there are one fixed probe assembly 11 and three motorized probe assemblies 12*a* to 12*c*. The fixed probe assembly 11 has three first probe tips 111, and each of the motorized probe assemblies 12*a* to 12*c* has three first probe tips 121. The under-test device 2 has a total of twelve pads (i.e., a quantity of the first pads 21 is three, and a quantity of the second pads 22 is nine). After completing step S3, the probe assemblies 1 and the under-test device 2 are positioned along the horizontal direction D2 (after completing step S5, the probe assemblies 1 and the under-test device 2 are positioned along the horizontal direction D2 and the vertical direction D1), as shown in FIG. 16. The thermal drift occurs after the under-test device 2 and the probe assemblies 1 are heated up, as shown in FIG. 17. By performing the positioning method of any one of the first to fifth embodiments described above, the positioning relationship between the probe assemblies 1 and the under-test device 2 as shown in FIG. 16 can be restored.

Seventh Embodiment

Figure 18:
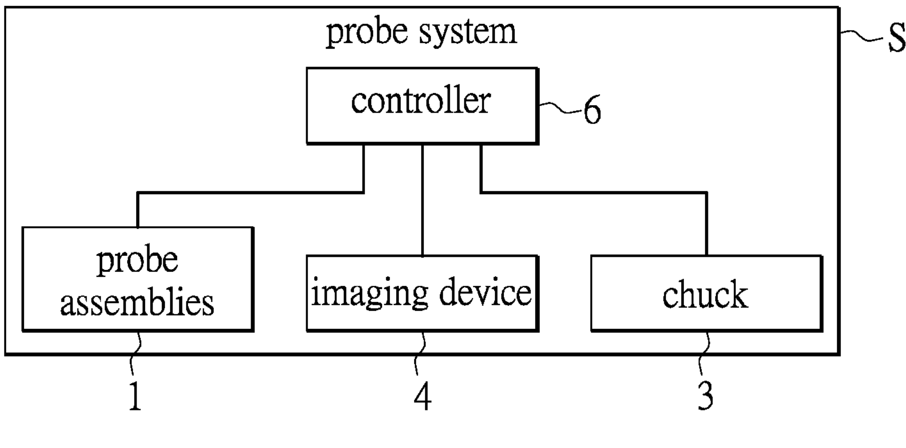
FIG. 18 is a schematic diagram of a probe system according to a seventh embodiment of the present invention.

Referring to FIG. 1 and FIG. 18, a seventh embodiment of the present invention provides a probe system S configured to test at least one under-test device 2. The probe system S includes a chuck 3, a plurality of probe assemblies 1, an imaging device 4, and a controller 6. The chuck 3 is configured to support a substrate that includes the under-test device 2. During a positioning process, at least one fixed probe assembly 11 and at least one motorized probe assembly 12 are defined among the probe assemblies 1. The imaging device is configured to obtain an optical image related to the under-test device 2 or the probe assembly 1. The controller 6 is programmed to perform the positioning method of any one of the first to fifth embodiments described above.

Under certain circumstances, it may be desirable to test the under-test device 2 under controlled environmental conditions. For example, it may be desirable to test the under-test device 2 at a predetermined temperature. In some examples, the temperature of the under-test device 2 is controlled by controlling the temperature of a temperature-controlled chuck that supports a substrate 5, and the substrate 5 includes the under-test device 2. In some examples, the chuck 3 may include a thermal control unit. The thermal control unit may be configured to control and/or regulate a temperature of the chuck support surface and/or of the substrate 5 when the substrate 5 is supported by the chuck support surface. Examples of the thermal control unit include a heating assembly, a cooling assembly, and/or a heat transfer assembly configured to exchange thermal energy with a temperature-controlled fluid stream. When the chuck 3 includes the thermal control unit, the chuck 3 may also be referred to as a thermal chuck 3 and/or as a temperature-controlled chuck 3 herein. The images acquired by the imaging device 4 include at least one of the following: an image of at least a portion of a substrate (such as a wafer) that includes one or multiple ones of the under-test device 2, or an image of at least a portion of a probe of the probe assembly 1 that is configured to test a corresponding one of one or more electronic components. Examples of the imaging device 4 include a camera, a video camera, a microscope, and/or a charge coupled device (CCD).

Eighth Embodiment

An eighth embodiment of the present invention provides a method for operating a probe system to test an under-test device. The method comprises the steps of S0 to S5, which are the same as the method 100. In some embodiments, the method comprises the steps of S0 to S3 and the steps of S6 to S7, which are the same as those mentioned in the method 200. In other embodiment, the method comprises the steps of S0 to S3 and the steps of Z4 to Z6, which are the same as the method 300. In another embodiment, the method comprises the steps of S0 to S5 and the steps of P6 to P8, which are the same as the method 400.

Ninth Embodiment

Figure 19:
FIG. 19 is a flowchart of a method for producing a tested semiconductor device according to a ninth embodiment of the present invention.
Figure 19:
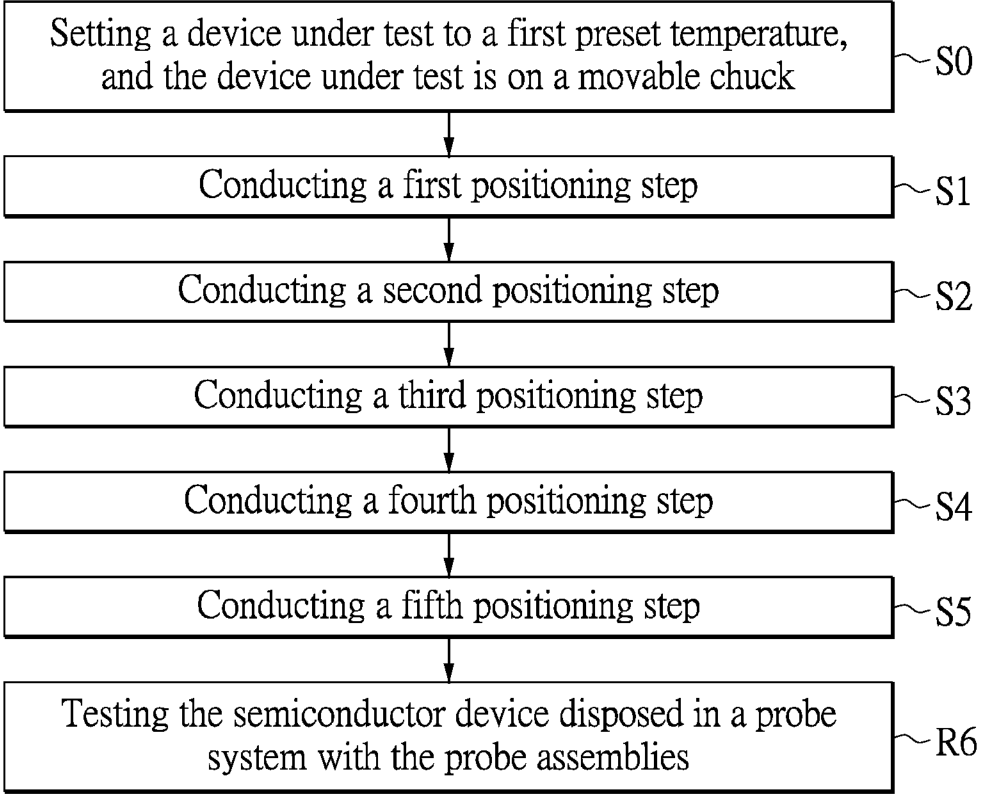

Referring to FIG. 19, a ninth embodiment of the present invention provides a method of producing a tested semiconductor device. The method 500 comprises the steps of S0 to S5, and further comprises the step of R6. The step R6 is of testing the semiconductor device disposed in the probe system with the probe assemblies 1. The semiconductor device such as chips, liquid crystal panels or wafers.

Tenth Embodiment

Reference is made to FIG. 1 to FIG. 10. Based on the above description, the present invention also provides a non-transitory computer readable storage media. The non-transitory computer readable storage media includes a plurality of computer-executable instructions. The computer-executable instructions are able to direct a probe system for performing the positioning method of any one of the first to fifth embodiments described above. A computer-readable storage media, when present, may also be referred to as the non-transitory computer readable storage media herein. This non-transitory computer readable storage media may include, define, house, and/or store computer-executable instructions, programs, and/or codes. These computer-executable instructions may direct the probe system S and/or the controller 6 thereof to perform any suitable portion or subset of the positioning methods 100 to 500. Examples of such non-transitory computer-readable storage media include CD-ROMs, disks, hard drives, flash memory, etc. As used herein, storage, or memory, devices and/or media having computer-executable instructions, as well as computer-implemented methods and other methods according to the present invention, are considered to be within the scope of subject matter deemed patentable in accordance with Section 101 of Title 35 of the United States Code.

BENEFICIAL EFFECTS OF THE EMBODIMENTS

In conclusion, according to one of the embodiments of the present invention, by arranging the at least one fixed probe assembly and cooperating with the at least one motorized probe assembly to position the pads of the under-test device during the test process, the use of the motorized probe assembly can be reduced, and the costs of positioning operations can be reduced.

Furthermore, according to one of the embodiments of the present invention, after heating, the first probe tip, the second probe tip, and the pads undergo the thermal drift. The first probe tip and the second probe tip can return to the relative pitch. In other words, the first probe tip and the second probe tip can be restored to an original relative position.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present invention pertains without departing from its spirit and scope.

What is claimed is:

1. A probe system configured to test one or more under-test devices that have a plurality of pads, the probe system comprising:

a chuck configured to support a substrate that has one or more under-test devices;

a plurality of probe assemblies having at least one fixed probe assembly and at least one motorized probe assembly;

an imaging device configured to obtain an optical image related to at least one of the under-test devices and the probe assemblies; and a controller programmed to perform a positioning method, comprising the steps of:

setting the under-test device at a first preset temperature, wherein the under-test device is disposed on the chuck that is movable;

conducting a first positioning step that is of arranging all of the probe assemblies to be in a standby position, wherein each of the probe assemblies has at least one probe tip, and the plurality of pads are situated at a predetermined distance below the at least one probe tip of each of the probe assemblies along a vertical direction for subsequent contact;

conducting a second positioning step that is of positioning a first probe tip of the fixed probe assembly according to a first pad of the under-test device, wherein the first pad is to be contacted by the first probe tip of the fixed probe assembly by moving the chuck along the vertical direction;

conducting a third positioning step that is of positioning a first probe tip of the motorized probe assembly according to a second pad of the under-test device, wherein the second pad is to be contacted by moving the first probe tip of the motorized probe assembly along the vertical direction;

conducting a fourth positioning step that is of moving the chuck along the vertical direction, so as to enable the first pad to be in physical contact with the first probe tip of the fixed probe assembly; and subsequently conducting a fifth positioning step that is of moving the at least one motorized probe assembly along the vertical direction, so as to enable the first probe tip of the motorized probe to be in physical contact with the second pad.

2. The probe system according to claim 1, wherein the positioning method further includes:

heating the one or more under-test devices, so that the one or more under-test devices are raised from the first preset temperature to a second preset temperature; and performing the second positioning step and the third positioning step again.

3. The probe system according to claim 1, wherein the positioning method further includes:

heating the under-test device, so that the under-test device is raised from the first preset temperature to a second preset temperature;

performing the second positioning step and the third positioning step again; and performing the fourth positioning step and the fifth positioning step again.

4. The probe system according to claim 1, wherein the positioning method further includes:

conducting a recording step that is of using the first probe tip of the fixed probe assembly or the first pad as a reference target, and recording a relative pitch between the first probe tip of the fixed probe assembly and the first probe tip of the motorized probe assembly, or recording a relative pitch between the first probe tip of the fixed probe assembly and the first pad;

heating the under-test device, so that the under-test device is raised from the first preset temperature to a second preset temperature; and conducting a restoring step that is of returning the first probe tip of the fixed probe assembly and the first probe tip of the motorized probe assembly to an original relative position in a working region according to the relative pitch recorded.

5. The probe system according to claim 1, wherein the positioning method further includes:

recording a position of the chuck with the first probe tip of the motorized probe assembly in the vertical direction and in the horizontal direction when the first probe tip of the motorized probe assembly contacts the second pad;

heating the under-test device, so that the under-test device is raised from the first preset temperature to a second preset temperature; and conducting a restoring step that is of returning the first probe tip of the motorized probe assembly and the chuck to the position in the vertical direction and in the horizontal direction according to the position recorded.

6. A positioning method for positioning a plurality of probe assemblies with one or more under-test devices that have a plurality of pads, each of the probe assemblies having at least one probe tip corresponding to one of the pads for contact, and at least one fixed probe assembly and at least one motorized probe assembly are defined among the probe assemblies, the positioning method comprising:

setting the under-test device at a first preset temperature, wherein the under-test device is disposed on a chuck that is movable;

conducting a first positioning step that is of arranging all of the probe assemblies to be in a standby position, wherein the plurality of pads are situated at a predetermined distance below the at least one probe tip along a vertical direction for subsequent contact;

conducting a second positioning step that is of positioning a first probe tip of the at least one fixed probe assembly according to a first pad of the under-test device, wherein the first pad is to be contacted by the first probe tip of the fixed probe assembly by moving the chuck along the vertical direction;

conducting a third positioning step that is of positioning a first probe tip of the motorized probe assembly according to a second pad of the under-test device, wherein the second pad is to be contacted by moving the first probe tip of the motorized probe assembly along the vertical direction;

conducting a fourth positioning step that is of moving the chuck along the vertical direction, so as to enable the first pad to be in physical contact with the first probe tip of the fixed probe assembly; and subsequently conducting a fifth positioning step that is of moving the at least one motorized probe assembly along the vertical direction, so as to enable the first probe tip of the motorized probe assembly to be in physical contact with the second pad.

7. The positioning method according to claim 6, further comprising:

heating the under-test device, so that the under-test device is raised from the first preset temperature to a second preset temperature; and performing the second positioning step and the third positioning step again.

8. The positioning method according to claim 6, further comprising:

heating the under-test device, so that the under-test device is raised from the first preset temperature to a second preset temperature;

performing the second positioning step and the third positioning step again; and performing the fourth positioning step and the fifth positioning step again.

9. The positioning method according to claim 6, further comprising:

conducting a recording step that is of using the first probe tip of the fixed probe assembly or the first pad as a reference target, and recording a relative pitch between the first probe tip of the fixed probe assembly and the first probe tip of the motorized probe assembly, or recording a relative pitch between the first probe tip of the fixed probe assembly and the first pad;

heating the under-test device, so that the under-test device is raised from the first preset temperature to a second preset temperature; and conducting a restoring step that is of returning the first probe tip of the fixed probe assembly and the first probe tip of the motorized probe assembly to an original relative position in a working region according to the relative pitch recorded.

10. The positioning method according to claim 6, further comprising:

recording a position of the chuck with the first probe tip of the motorized probe assembly in the vertical direction and in the horizontal direction when the first probe tip of the motorized probe assembly contacts the second pad;

heating the under-test device, so that the under-test device is raised from the first preset temperature to a second preset temperature; and conducting a restoring step that is of returning the first probe tip of the motorized probe assembly and the chuck to the position in the vertical direction and in the horizontal direction according to the position recorded.

11. A non-transitory computer readable storage media, comprising:

a plurality of computer-executable instructions, wherein when the computer-executable instructions are executed, a probe system correspondingly performs the positioning method as claimed in claim 6.

12. A method for producing a tested semiconductor device, comprising:

performing the positioning method as claimed in claim 6; and testing the semiconductor device disposed in a probe system with the probe assemblies.

13. A method for operating a probe system to test an under-test device, wherein the under-test device has a plurality of pads, the method comprising:

providing a probe system, which has a plurality of probe assemblies, each of the probe assemblies having at least one probe tip corresponding to one of the pads for contact, at least one fixed probe assembly and at least one motorized probe assembly are defined among the probe assemblies;

setting the under-test device at a first preset temperature, wherein the under-test device is disposed on a chuck that is movable;

arranging all of the probe assemblies to be in a standby position, wherein the plurality of pads are situated at a predetermined distance below the at least one probe tip along a vertical direction for subsequent contact;

positioning a first probe tip of the fixed probe assembly according to a first pad of the under-test device, wherein the first pad is to be contacted by the first probe tip of the fixed probe assembly by moving the chuck along the vertical direction;

positioning a first probe tip of the motorized probe assembly according to a second pad of the under-test device, wherein the second pad is to be contacted by moving the first probe tip of the motorized probe assembly along the vertical direction;

moving the chuck along the vertical direction, so as to enable the first pad to be in physical contact with the first probe tip of the fixed probe assembly within a working region; and subsequently moving the at least one motorized probe assembly along the vertical direction, so as to enable the first probe tip of the motorized probe assembly to be in physical contact with the second pad within the working region.

14. The method according to claim 13, further comprising:

heating the under-test device, so that the under-test device is raised from the first preset temperature to a second preset temperature; and positioning a first probe tip of the fixed probe assembly with a first pad in a working region, wherein the first pad is to be contacted by the first probe tip of the fixed probe assembly; and positioning a first probe tip of the motorized probe assembly with a second pad in the working region, wherein the second pad is to be contacted by the first probe tip of the motorized probe assembly.

15. The method according to claim 13, further comprising:

heating the under-test device, so that the under-test device is raised from the first preset temperature to a second preset temperature;

positioning a first probe tip of the fixed probe assembly with a first pad in the working region, wherein the first pad is to be contacted by the first probe tip of the fixed probe assembly;

positioning a first probe tip of the motorized probe assembly with a second pad in the working region, wherein the second pad is to be contacted by the first probe tip of the motorized probe assembly;

moving the chuck along the vertical direction, so as to enable the first pad to be in physical contact with the first probe tip of the fixed probe assembly; and moving the at least one motorized probe assembly along the vertical direction, so as to enable the first probe tip of the motorized probe assembly to be in physical contact with the second pad.

16. The method according to claim 13, further comprising:

using the first probe tip of the fixed probe assembly or the first pad as a reference target, and recording a relative pitch between the first probe tip of the fixed probe assembly and the first probe tip of the motorized probe assembly;

heating the under-test device, so that the under-test device is raised from the first preset temperature to a second preset temperature; and returning the first probe tip of the fixed probe assembly and the first probe tip of the motorized probe assembly to an original relative position in a working region according to the relative pitch recorded.

17. The positioning method according to claim 14, further comprising:

recording a position of the chuck with the first probe tip of the motorized probe assembly in the vertical direction and in the horizontal direction when the first probe tip of the motorized probe assembly contacts the second pad;

heating the under-test device, so that the under-test device is raised from the first preset temperature to a second preset temperature; and returning the first probe tip of the motorized probe assembly and the chuck to the position in the vertical direction and in the horizontal direction according to the position recorded.

* * * * *